United States Patent [19]
Viswanathan

[11] Patent Number: 6,018,269
[45] Date of Patent: Jan. 25, 2000

[54] PROGRAMMABLE GAIN AMPLIFIER

[75] Inventor: T. Lakshmi Viswanathan, Addison, Tex.

[73] Assignee: Texas Instruments Incorporated, Dallas, Tex.

[21] Appl. No.: 08/996,952

[22] Filed: Dec. 23, 1997

[51] Int. Cl.[7] .................................................. H03F 3/45
[52] U.S. Cl. .......................... 330/254; 330/257; 330/253
[58] Field of Search .................................... 330/254, 257, 330/253, 252

[56] References Cited

U.S. PATENT DOCUMENTS

| | | | |
|---|---|---|---|
| 5,198,780 | 3/1993 | Kase ........................................ | 330/254 |
| 5,412,346 | 5/1995 | Burger, Jr. et al. ..................... | 330/282 |
| 5,600,280 | 2/1997 | Zhang ..................................... | 330/253 |
| 5,612,648 | 3/1997 | McClellan et al. ..................... | 330/253 |
| 5,642,077 | 6/1997 | Nagaraj .................................... | 330/253 |
| 5,642,078 | 6/1997 | Navabi et al. .......................... | 330/254 |

OTHER PUBLICATIONS

Viswanathan, T. Lakshmi, "CMOS Transconductance Element," *Proceedings of the IEEE*, vol. 74, No. 1, pp. 222–224, Jan. 1986.

Rijns, J.J.F., "CMOS Low–Distortion High–Frequency Variable–Gain Amplifier," *IEEE Journal of Solid–State Circuits*, vol. 31, No. 7, pp. 1029–1034, Jul. 1996.

*Primary Examiner*—Robert Pascal
*Assistant Examiner*—Khanh Van Nguyen
*Attorney, Agent, or Firm*—W. Daniel Swayze, Jr.; Wade James Brady, III; Richard L. Donaldson

[57] ABSTRACT

A method for producing gain in an electrical signal includes providing a variable resistance system having a plurality of transistors connected in parallel and controlling the resistance of the variable resistance system by applying a voltage to a control node of each of the plurality of transistors to selectively turn each transistor on or off. The method also includes receiving a differential input voltage and applying the differential input voltage across the variable resistance system to produce a signal current. The method also includes providing at least a portion of the signal current to a load resistance system to generate a differential output voltage and setting the ratio of the differential output voltage to the differential input voltage by controlling the voltage applied to the control node of each of the plurality of transistors.

20 Claims, 3 Drawing Sheets

PROGRAMMABLE GAIN AMPLIFIER

TECHNICAL FIELD OF THE INVENTION

This invention relates generally to amplifiers and more particularly to a programmable gain amplifier.

BACKGROUND OF THE INVENTION

Amplifiers are commonly used in electronic applications. One example of the use of an amplifier is in a read channel of a hard disk drive. A read channel of a hard disk drive receives an analog signal from magnetic media of a hard disk drive and converts the analog signal into a digital form for processing by a computer. A particular type of amplifier is a programmable gain amplifier. The gain of a programmable gain amplifier is adjustable. A programmable gain amplifier may be particularly useful in the read channel of a hard disk drive because the magnitude of analog signals read from a magnetic media may vary with type of drive. Therefore, a programmable gain amplifier facilitates amplification of these varying magnitudes to appropriate levels.

In some applications, it is desirable to have a programmable gain amplifier that requires only CMOS active elements. Because of the widespread use of CMOS technology, the manufacture of CMOS devices is relatively inexpensive. In addition, the use of only CMOS devices allows easy transferability to advancing technologies incorporating smaller and smaller designs. Furthermore, the avoidance of passive elements, such as resistors or capacitors, reduces the size required to implement these circuit elements.

Because a wide range of frequencies is required in hard disk drive applications, a programmable gain amplifier for use in such an application requires a wide bandwidth. Traditional operational amplifiers cannot accommodate a wide bandwidth over a range of gains. It is also desirable to produce a programmable gain amplifier that can operate at low voltage to accommodate low voltage technology.

SUMMARY OF THE INVENTION

Accordingly, a need has arisen for an improved programmable gain amplifier and method. The present invention provides a programmable gain amplifier and method that addresses shortcomings of prior amplifiers and methods.

According to one embodiment of the invention, a method for producing gain in an electrical signal includes providing a variable resistance system having a plurality of transistors connected in parallel and controlling the resistance of the variable resistance system by applying a voltage to a control node of each of the plurality of transistors to selectively turn each transistor on or off. The method also includes receiving a differential input voltage and applying the differential voltage across the variable resistance system to produce a signal current. The method also includes providing at least a portion of the signal current to a load resistance system to generate a differential output voltage and setting the ratio of the differential output voltage to the differential input voltage by controlling the voltage applied to the control node of each of the plurality of transistors.

According to another embodiment of the invention, a programmable gain amplifier for producing a programmable voltage gain includes a voltage input differential pair operable to receive a differential voltage input signal. The voltage input differential pair comprises a first input node and a second input node. The first input node is for receiving a first voltage input signal and the second input node is for receiving a second voltage input signal. A variable resistance system is disposed between the first input node and the second input node and is operable to produce a signal current through the variable resistance system in response to the differential voltage input signal. The variable resistance system includes a plurality of transistors connected in parallel. The amplifier also includes a load resistance system operable to receive at least a portion of the signal current and produce a voltage drop across the load resistance system. The ratio of the differential voltage input signal to the voltage drop across the load resistance system is affected by the resistance of the variable resistance system.

The invention provides numerous technical advantages. For example, the invention provides a programmable gain amplifier that utilizes only CMOS devices and does not utilize passive elements. Furthermore, the invention allows operation of a programmable gain amplifier at low voltages. Moreover, the invention provides a programmable gain amplifier having a wide bandwidth that may be utilized in applications such as in the read channel of a hard disk drive. The use of feedback around conventional open loop amplifiers to adjust their gain results in bandwidth limitations that are not present in the present invention.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF THE INVENTION

Embodiments of the present invention and its advantages are best understood by referring to FIGS. 1 through 4 of the drawings, like numerals being used for like and corresponding parts of the various drawings.

Figure 1:
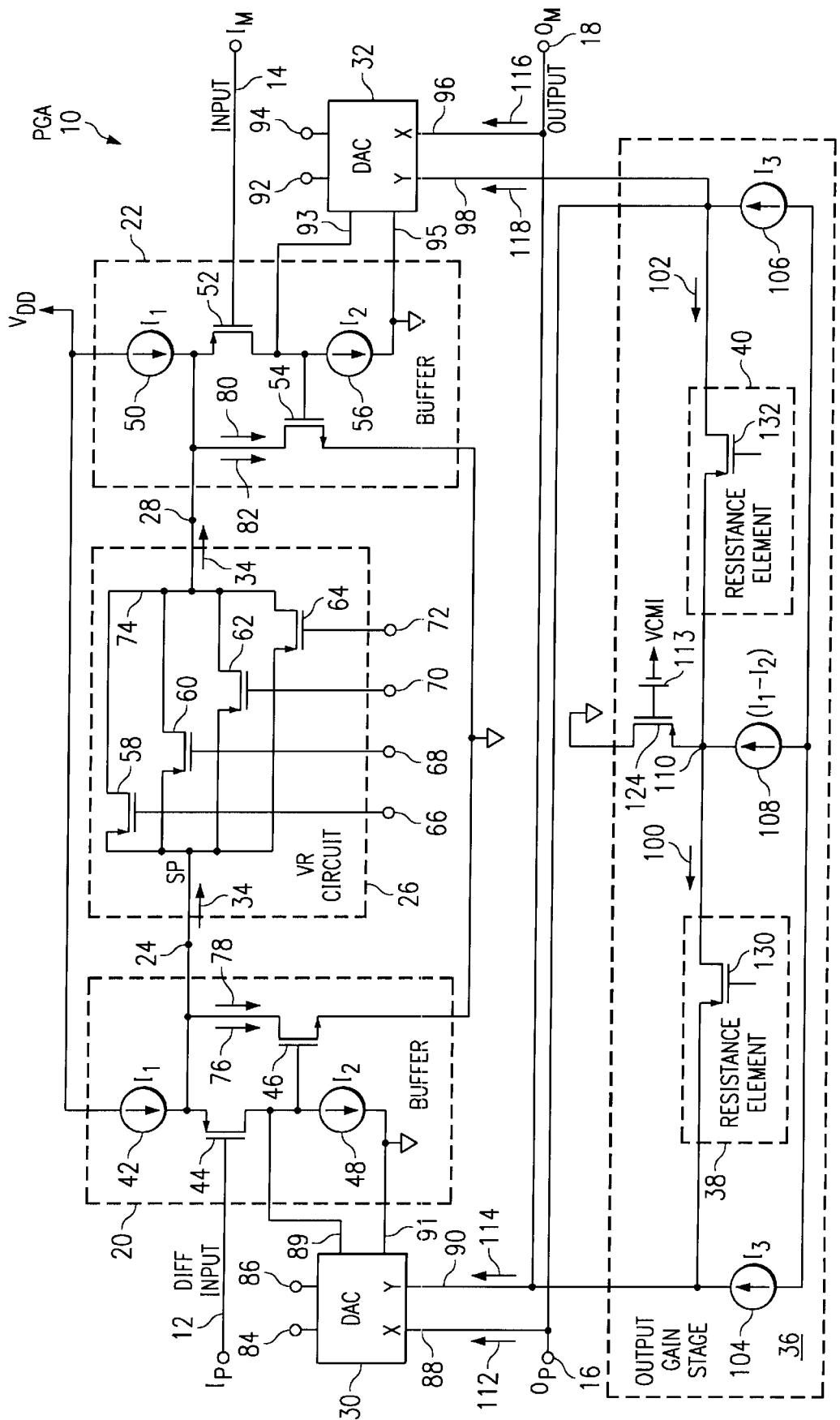
FIG. 1 is a schematic diagram illustrating an embodiment of a programmable gain amplifier circuit constructed in accordance with the teachings of the invention.

FIG. 1 illustrates a schematic diagram of an embodiment of a programmable gain amplifier 10 constructed in accordance with the teachings of the invention. Programmable gain amplifier 10 includes a pair of differential input nodes 12 and 14. Differential input nodes 12 and 14 receive a differential input voltage for programmable gain amplifier 10. Programmable gain amplifier 10 also includes a pair of differential output nodes 16 and 18, which provide a differential output voltage. A gain 19 of programmable gain amplifier 10 may be represented by the formula:

$$\text{Gain} = \frac{V_{16} - V_{18}}{V_{12} - V_{14}} \quad (1)$$

where:
Gain=gain 19;
$V_{16}$=voltage at output node 16;
$V_{18}$=voltage at output node 18;
$V_{12}$=voltage at input node 12; and
$V_{14}$=voltage at input node 14.

According to the teachings of the invention, gain 19 of programmable gain amplifier 10 may be varied as necessary for a particular application, including for varying the gain of an amplifier in a read channel of a hard disk drive.

Programmable gain amplifier 10 includes a pair of buffers 20 and 22. Buffer 20 buffers its output voltage at a node 24 from a source connected to input node 12. Buffer 22 buffers its output voltage at a node 28 from a source connected to input node 14. Buffers 20 and 22 therefore cooperate to provide a differential voltage across variable resistance circuit 26. The differential voltage applied across variable resistance circuit causes a signal current 34 to flow through variable resistance circuit 26. As described in greater detail below, portions of signal current 34 are used to effect a variable gain 19 for programmable gain amplifier 10.

Programmable gain amplifier 10 also includes a pair of digital-to-analog converters 30 and 32. Digital-to-analog converters 30 and 32 receive portions of signal current 34 and provide portions of current 34 to an output gain stage 36. Portions of signal current 34. exiting digital-to-analog converters are then provided to a resistance element 38 and a resistance element 40 in output gain stage 36. A voltage drop across resistance element 38 and resistance element 40 due to a first load current 100 through resistance element 38 and second load current 102 through resistance element 40 results in a differential voltage between output node 16 and output node 18. Gain 19 of programmable gain amplifier 10 is therefore determined by the relationship between resistance elements 38 and 40 and variable resistance circuit 26 and also determined by the relationship between current 34 and first and second load currents 100 and 102. Details on varying gain 19 are described below in conjunction with FIGS. 2 through 4.

Because the resistance of variable resistance circuit 26 affects the gain of programmable gain amplifier 10, gain 19 of programmable gain amplifier 10 may be programmed by adjusting the resistance of variable resistance circuit 26. In addition, the amount of first load current 100 and second load current 102 flowing through resistance elements 38 and 40, respectively, also affects gain 19. Therefore, programming digital-to-analog converters 30 and 32, affects gain 19 of programmable gain amplifier 10.

Buffer 20 isolates input node 12 from other portions of programmable gain amplifier to prevent current from flowing into input 12. Similarly, buffer 22 isolates input node 14 from other portions of programmable gain amplifier 10 to prevent current from flowing to input node 14. Buffer 20 and 22 have two properties that are utilized in the present invention. The first property is buffering input voltages at nodes 24 and 28. The second is that current 34 flowing through variable resister 26 appears as a change in drain current in transistor 46 and 54. This variation in drain current is proportional to the differential voltage across variable resistance circuit 26. This enables the use of digital-to-analog converters 30 and 32 to provide an output current that is proportional to drain currents in transistors 46 and 54, respectively.

In the embodiment illustrated in FIG. 1, buffer 20 includes a current source 42. Current source 42 produces a current $I_1$. Buffer 20 also includes a pair of field-effect transistors 44 and 46. Transistor 44 is a p-channel field-effect transistor having a gate connected to input node 12. Transistor 46 is an n-channel field-effect transistor having a source connected to ground, a drain connected to node 24, and a gate connected to the drain of transistor 44. Buffer 20 also includes a second current source 48 that produces a current 12. In this embodiment, buffers 20 and 22 are precision source followers; however, other types of buffers may be used for buffers 20 and 22. Additional details regarding a precision source follower, such as buffers 20 and 22 are described in *CMOS Transconductance Element*, Viswanathan, T. L., proceedings of the IEEE, Volume 74, No. 1, January 1986, pages 222–224, and *CMOS Low-Distortion High-Frequency Variable-Gain Amplifier*, Rijns, J. J. F., IEEE Journal of Solid State Circuits, Volume 31, No. 7, July 1996, pages 1029–1034, which are incorporated herein by reference. Although a particular configuration of buffer 12 has been shown, other buffers that are operable to place an input voltage applied to input node 12 at node 24 and that isolate input node 12 from current flowing in programmable gain amplifier 10 may be used.

Buffer 22 is analogous to buffer 20. Buffer 22 isolates input node 14 from portions of programmable gain amplifier 10 and places an input voltage applied at input 14 at node 28. In the embodiment illustrated in FIG. 1, buffer 22 includes a current source 50. Current source 50 also produces a current $I_1$. Buffer 22 also includes a pair of field effect transistors 52 and 54. Transistor 52 is a p-channel field-effect transistor having a gate connected to input node 14. Transistor 54 is an n-channel field effect transistor having a source connected to ground, a drain connected to node 28 and a gate connected to the drain of transistor 52. The operation of buffer 22 is analogous to the operation of buffer 20.

Placing nodes 24 and 28 on opposite sides of variable resistance circuit 26 therefore places the input differential voltage applied between input nodes 12 and input nodes 14 across variable resistance circuit 26. Variable resistance circuit 26 includes a plurality of field-effect transistors 58, 60, 62, and 64 connected in parallel. In the embodiment, transistors 58, 60, 62, and 64 are identical. Although each transistor 58, 60, 62, and 64 is illustrated as a p-channel field effect transistor, other types of transistors may be utilized.

Each gate of transistors 58, 60, 62, and 64 is connected to a control node 66, 68, 70, and 72, respectively. The resistance of a field-effect transistor may be controlled by its gate-to-drain voltage. Therefore, control nodes 66, 68, 70, and 72 may be set high or low to control transistors 58, 60, 62, and 64. For example, if control node 66 is set sufficiently high, transistor 58 acts as an open circuit, and no current flows through transistor 58. Conversely, if control node 66 is set sufficiently low, transistor 58 turns on and acts as a resistor with some current flowing through it. The value of the resistance of transistor 58 when it is turned on is affected somewhat by the common mode voltage level applied at input nodes 12 and 14 because the resistance of a transistor when it is turned on depends on the common mode voltage of voltage applied at its source and drain. According to one embodiment, the common mode voltage of the voltages applied at the sources and drains of transistors 58, 60, 62, and 64 is set sufficiently high such that transistors 58, 60, 62, and 64 operate in the triode mode. No additional gate bias voltage is required for transistors 58, 60, 62, and 64.

In the embodiment illustrated in FIG. 1, a high voltage for control nodes 66, 68, 70, and 72 is in the range between 3 and 3.6 volts and a low voltage for nodes 66, 68, 70, and 72 is ground. Control nodes 66, 68, 70, and 72 may be controlled by two control bits by, for example, a memory location in a processor (not explicitly shown).

The magnitude of signal current 34 depends upon the resistance of variable resistance circuit 26 and the applied input differential voltage between input node 12 and input node 14. For example, if control nodes 66 and 68 are set high and control nodes 70 and 72 are set low, the resistance of variable resistance circuit 26 is twice what the resistance would be if all four control nodes 66, 68, 70, and 72 are set low. Therefore, signal current 34 flowing through variable resistance circuit 26 is one-half as much as it is when all four control nodes 66, 68, 70, and 72 are set low. Because signal current 34 is dependent upon the difference in voltage between input node 12 and input node 14, signal current 34 may be utilized to facilitate amplification and produce an output voltage differential between output node 16 and output node 18 that is greater than the input voltage differential between input node 12 and input node 14, thereby producing gain 19. Because the magnitude of signal current 34 may be varied through control nodes 66, 68, 70, and 72, gain 19 of programmable gain amplifier 10 may be adjusted by appropriately setting control nodes 66, 68, 70, and 72.

Signal current 34 is utilized within other portions of programmable gain amplifier to produce gain 19. Signal current 34 is available for amplification at the drains of transistors 46 and 54 in buffers 20 and 22, respectively. However, a current 76 through n-channel field effect transistor 46 is dependent on current 34 in a manner described by the formula $$I_{76}=I_1-I_2-I_{34} \quad (2)$$

where:

$I_{76}$=current 76;

$I_1$=current produced by current source 42 or 50;

$I_2$=current produced by current source 48 or 56; and $I_{34}$=current 34.

Similarly a current 80 through n-channel field effect transistor 54 is dependent on current 34 in a manner described by the formula $$I_{80}=I_1-I_2+I_{34} \quad (3)$$

where:

$I_{80}$=current 80;

$I_1$=current produced by current source 42 or 50;

$I_2$=current produced by current source 48 or 56; and $I_{34}$=current 34.

Drain currents 76 and 80 are utilized to effect a current gain, which is then converted into a voltage gain to provide gain 19 of programmable gain amplifier 10. As shown by equations (2) and (3), currents 76 and 80 have a constant portion of $I_1-I_2$ and an equal and opposite portion $-I_{34}$ and $I_{34}$, respectively.

Digital-to-analog converters 30 and 32 operate in conjunction with output gain stage 36 to eliminate the bias current components 78 and 82 of drain currents 76 and 80, respectively. Digital-to-analog converters 30 and 32 also facilitate fine variation on the amount of gain 19 provided by programmable gain amplifier 10, as described in greater detail below in conjunction with FIG. 3.

In the illustrated embodiment, digital-to-analog converter 30 is a current digital-to-analog converter having digital voltage input nodes 84 and 86 and analog current output nodes 88 and 90. Digital-to-analog converter 30 is connected to buffer 20 at nodes 89 and 91. Digital-to-analog converter 30 acts as a current mirror that produces, as an output, a current that is a multiple of the drain current 76. The output of digital-to-analog converter 30 is in the form of two output currents 112 and 114, illustrated as flowing into output nodes 88 and 90. The sum of output currents 112 and 114 is a multiple of drain current 76. The relative magnitude of output currents 112 and 114 transmitted by digital-to-analog converter 30 is controlled by voltage input nodes 84 and 86. Voltage input nodes 84 and 86 may be controlled by memory locations in, for example, a processor (not explicitly shown). Output node 88 of digital-to-analog converter 30 is connected to output node 16 of programmable gain amplifier 10 and output node 90 is connected to output node 18 of programmable gain amplifier 10.

Digital-to-analog converter 32 is analogous to digital-to-analog converter 30 and digital voltage input nodes 92 and 94 and analog current output nodes 96 and 98. Digital-to-analog converter 32 is connected to buffer 22 at nodes 93 and 95. An output current 118 is illustrated as flowing into output node 98, and an output current 116 is illustrated as flowing into output node 96. Digital-to-analog converters 30 and 32 are coupled by connecting output node 88 of digital-to-analog converter 30 to output node 98 of digital-to-analog converter 32 and by connecting output node 90 of digital-to-analog converter 30 to output node 96 of digital-to-analog converter 32. As described in greater detail below, cross-coupling of digital-to-analog converters 30 and 32 allows isolation of signal current 34 such that a relationship exists between the resistance of variable resistance circuit 26 and the resistance of resistance elements 38 and 40 that determines gain 19 of programmable gain amplifier 10.

Digital-to-analog converters 30 and 32 mirror drain currents 76 and 80, respectively. In one embodiment, output current 112 at output node 88 is equal to drain current 76, and output current at output node 98 is equal to drain current 80. In other embodiments, digital-to-analog converter 30 multiplies drain current 76 and splits the resulting multiple into two components that are transmitted as output currents 112 and 114 at output nodes 88 and 90. Digital-to-analog converter 32 operates in a similar fashion and produces output currents 116 and 118 at output nodes 96 and 98. As described in greater detail in conjunction with FIGS. 2 and 3, splitting the outputs currents of digital-to-analog converters 30 and 32 into two components allows fine tuning of gain 19 provided by programmable gain amplifier 10.

Output stage 36 receives output currents 112 and 114 from digital-to-analog converter 30 and output currents 116 and 118 from digital-to-analog converter 32. As illustrated, output node 88 of digital-to-analog converter 30 is connected to node 98 of digital-to-analog converter 32. In addition, output node 96 of digital-to-analog converter 32 is connected to output node 90 of digital-to-analog converter 90. This configuration results in first load current 100 through resistance element 38 and a second load current 102 through resistance element 40. A voltage drop across resistance element 38 affects the output voltage at output node 18. Similarly, a voltage drop across resistance element 40 affects the output voltage at output node 16.

In one embodiment, resistance elements 38 and 40 are p-channel field-effect transistors 130 and 132 and are the same type of transistors as transistors 58, 60, 62, and 64 used in variable resistance circuit 26. In addition, the common-mode voltage of transistors 130 and 132 is set to the same common-mode voltage of transistors 58, 60, 62, and 64 so that each transistor possesses the same voltage-current characteristic and therefore the same resistance. The setting of the common mode voltage for transistors 130 and 132 is accomplished by applying the common mode applied across transistors 58, 60, 67, and 64, to the gate of a transistor 124. The application of such a voltage is depicted by a voltage source 113. Transistor 124 has a drain connected to ground and a source connected to node 110 between resistance element 38 and resistance element 40. This orientation provides a common-mode voltage for both transistors 130 and 132 that is approximately the same common-mode voltage as that across transistors 58, 60, 62, and 64. Thus, voltage gain 19 of programmable gain amplifier 10 may be set by proper proportioning of first load current 100 and second load current 102 with signal current 34.

Output gain stage 36 also includes current sources 104 and 106. Current sources 104 and 106 each produce a current of $I_3$. A current source 108 produces a current source of $I_3$. Resistance element 38 provides a resistance load between output node 18 and node 110. Resistance element 40 provides a resistance load between output node 16 and output node 18. Proper selection of values for receipt by input nodes 84 and 86, input nodes 92 and 94, and control nodes 66, 68, 70, and 72 of variable resistance circuit 26 are described in conjunction with FIGS. 2 and 3 below.

Figure 2:
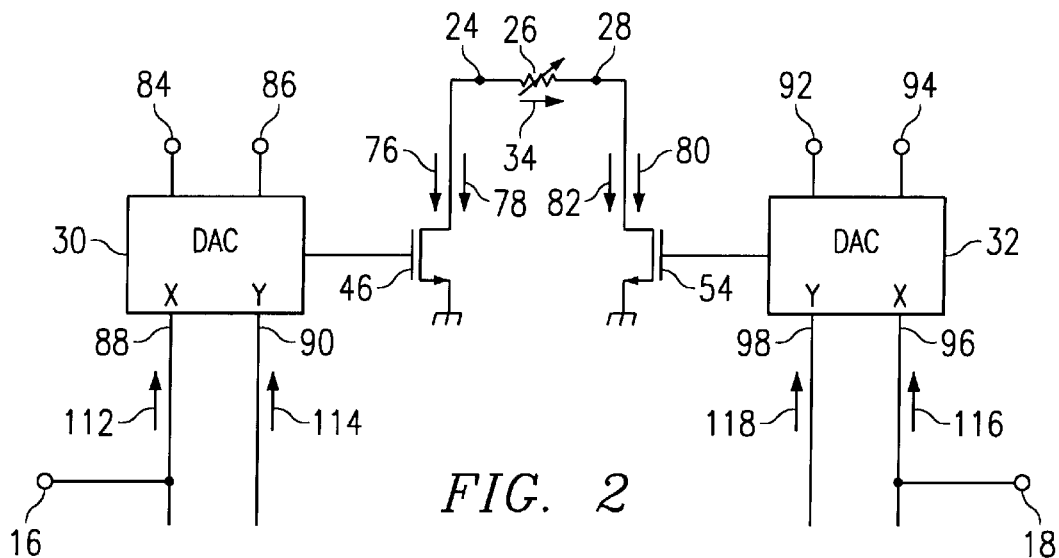
FIG. 2 is a schematic diagram illustrating a portion of the programmable gain amplifier circuit illustrated in FIG. 1, showing the mirroring of current through an adjustable resistor to another portion of the circuit.

FIG. 2 illustrates a schematic diagram of a portion of programmable gain amplifier 10 illustrated in FIG. 1, showing the mirroring of currents 76 and 80 to another portion of the circuit. As illustrated in FIG. 2, output current 112 flowing into output node 88 of digital-to-analog converter 30 is equal to:

$$I_{112}=K(I_B-I_S)(1-A) \quad (4)$$

where:

$I_{112}$=output current 112;

K=a constant that determines the gain of digital-to-analog converter 30;

$I_B-I_S$=drain current 76 ($I_{76}$) through transistor 46;

$I_B$=bias current 78;

$I_S$=signal current 34; and

A=the fractional amount in the range of 0 to 1 of current flow into output node 90, which is determined by input nodes 84 and 86 according to conventional techniques.

Thus, digital-to-analog converter 30 amplifies current 76 by a gain K and splits the resulting current into two components, which are output currents 112 and 114. The relative magnitude of output currents 112 and 114 is determined by the variable "A." Variable "A" is controlled by input voltage nodes 84 and 86 according to conventional techniques. In a simplified case in which the gain K of digital-to-analog converter 30 is unity and in which A=0, which means that all output current from digital-to-analog converter 30 flows into output node 112, current 112 is equal to current 76.

Output current 114 into output node 90 of digital-to-analog converter 30 may be similarly calculated to be equal to:

$$I_{114}=K(I_B-I_S)(A) \quad (5)$$

The operation of digital-to-analog 32 is analogous to the operation of digital-to-analog converter 30. Output current 116 into output node 96 of digital-to-analog converter 32 is equal to:

$$I_{116}=K(I_B+I_S)(1-A) \quad (6)$$

where:

$I_{116}$=output current 116;

K=a constant that determines the gain of digital-to-analog converter 30;

$I_B+I_S$=equals drain current 80 ($I_{80}$);

$I_B$=bias current 82;

$I_S$=signal current 34; and

A=the fractional amount of current flow into output node 96, which is determined by input nodes 92 and 94 according to conventional techniques.

In the described embodiment, the constant "A" for digital-to-analog converter 30 is equal to the constant "A" for digital-to-analog converter 32. This may be accomplished by setting the voltages applied at input nodes 84 and 86 the same as the voltages applied at input nodes 94 and 92, respectively. However, other suitable values for "A" in both digital-to-analog converters 30 and 32 may be utilized.

Output current 118 into output node 98 of digital-to-analog converter 32 may be similarly calculated to be equal to:

$$I_{118}=K(I_B+I_S)A \quad (7)$$

Thus, digital-to-analog converter 32 amplifies drain current 80 by a gain K and splits the resulting current into two components, which are output currents 98 and 96. Because buffers 20 and 22 are identical, bias current 76 and bias current 80 are equal. Therefore, $I_B$ in equations 4 through 7 represent both bias current 76 and bias current 80. As demonstrated below, output currents 112, 114, 116, and 118 may be combined within output gain stage 36 to provide a relationship between a current within output gain stage 36 and signal current 34 that is independent of bias currents 76 and 80.

Figure 3:
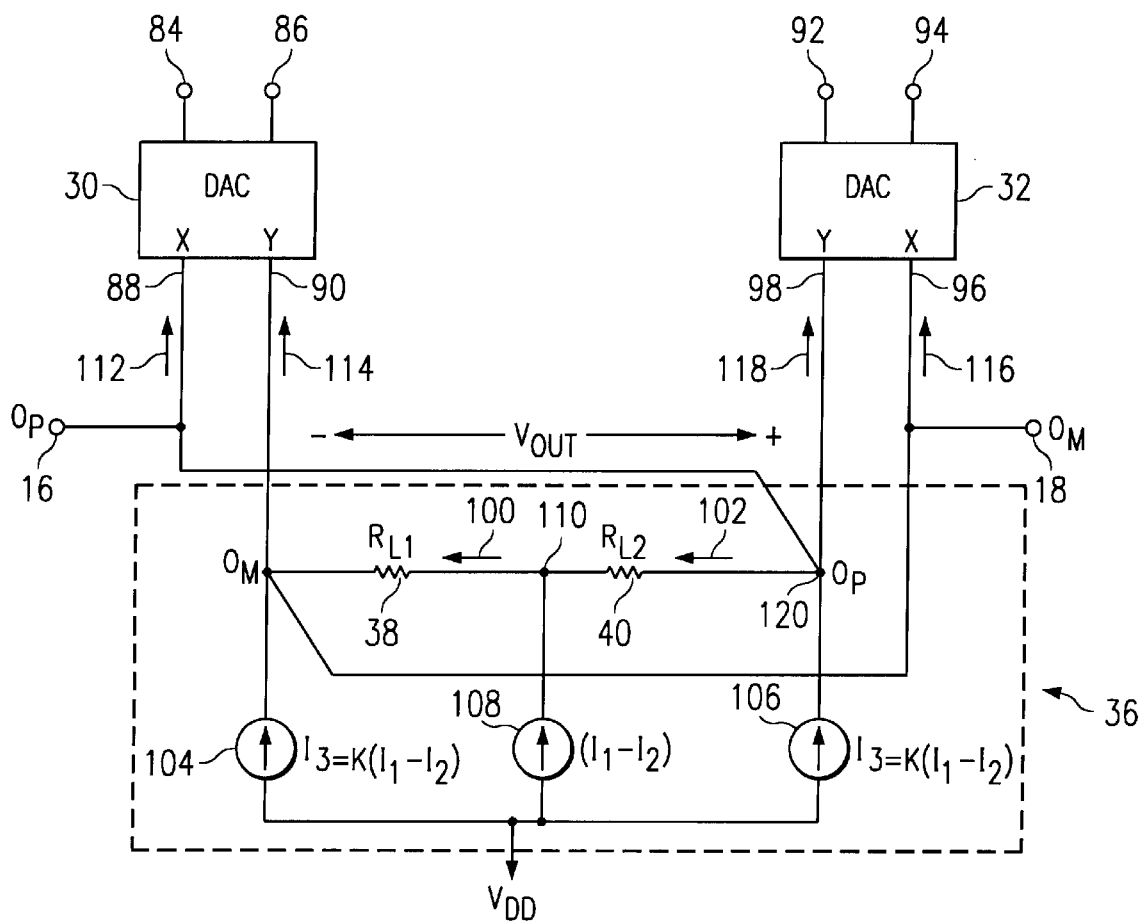
FIG. 3 is a schematic diagram illustrating a portion of the programmable gain amplifier circuit illustrated in FIG. 1, further showing an output gain stage for the programmable gain amplifier.

FIG. 3 illustrates a schematic diagram showing a portion of programmable gain amplifier 10, further illustrating output gain stage 36. For simplicity of illustration, transistor 124 and voltage source 113 have been removed from FIG. 3. Load current 102 out of node 120 is equal to the sum of the currents into node 120. The currents leaving node 120 are current 102 through resistance element 40, current 118 into output node 98 of digital-to-analog converter 32, current 112 into output node 88 of digital-to-analog converter 30, and current source 106, which produces a current $I_3$. Therefore, load current 102 is out of node 120 equal to:

$$I_{102}=I_3-[KA(I_S+I_B)+K(1-A)(I_B-I_S)] \quad (8)$$

where:

$I_{102}$=load current 102;

$I_S$=signal current 34;

$I_B$=bias current 82=bias current 78;

K=a constant that determines the gain of digital-to-analog converter 30; and A=the fractional amount of current flow into output nodes 16, 88, and 96, which is determined by input nodes 84, 86, 92 and 94 according to conventional techniques.

If $I_3$ is chosen to be equal to $K(I_1-I_2)$, output current 102 is equal to:

$$I_{102}=KI_B-[2KAI_S+KI_B-KI_S] \quad (9)$$

$$I_{102}=-KI_S(2A-1) \quad (10)$$

Current 100 through resistance element 38 may be calculated similarly to be $KI_S(2A-1)$.

From FIG. 1 it can be seen that signal current 34, or $I_S$, equals the voltage differential between input node 12 and input node 14 divided by the resistance of variable resistance circuit 26, or $$I_S = \frac{V_{12} - V_{14}}{R_{26}} \tag{11}$$

utilizing equations 1, 10, and 11, the gain of programmable gain amplifier 10 may be shown to be:

$$\text{Gain (19)} = \tag{12}$$

$$\frac{V_{16} - V_{18}}{V_{12} - V_{14}} = \frac{(I_{100})(R_{38}) + (I_{102})(R_{40})}{(I_S)(R_{26})} = \frac{-(R_{38} + R_{40})}{R_{26}}[2A - 1]K$$

where:

Gain (19)=gain 19 of amplifier 10;

$V_{12}$=voltage applied at input node 12;

$V_{14}$=voltage applied at input node 14;

$V_{16}$=voltage at output node 16;

$V_{18}$=voltage at output node 18;

$R_{26}$=the resistance of resistance element 26;

$R_{38}$=the resistance of resistance element 38; and $R_{40}$=resistance of resistance element 40; and A and K are defined above.

Because A and K are constants defined by digital-to-analog converters 30 and 32, the above equation 10, provides a relationship between gain 19 of programmable gain amplifier 10 and the ratio of resistance elements 38 and 40 to the resistance variable resistance circuit 26. The gain of programmable gain amplifier 10 may therefore be adjusted by varying the resistance of variable resistance circuit 26. Adjusting the resistance of variable resistance circuit 26 may be effected through setting control nodes 66, 68, 70, 72 high or low as described above.

If the resistance of resistance element 40, $R_{40}$, is set equal to the resistance of resistance element 38, gain 19 is:

$$\text{Gain (19)} = \frac{-2R_{38}}{R_{26}}[2A - 1]K. \tag{13}$$

If the resistance of variable resistance circuit 26 is set equal to the resistance of resistance elements 38 and 40, gain 19 is:

$$\text{Gain (19)} = -2K(2A-1). \tag{14}$$

Therefore, gain 19 may assume the following example values:

$$\text{Gain (19)} = 2K \text{ for } A = 0; \tag{15}$$

$$0 \text{ for } A = 1/2; \text{ and}$$

$$-2K \text{ for } A = 1.$$

Thus gain 19 may be fine-tuned by altering the constant "A" by applying appropriate input voltages at input nodes 84, 86, 92, and 94 of digital-to-analog converts 30 and 32.

Figure 4:
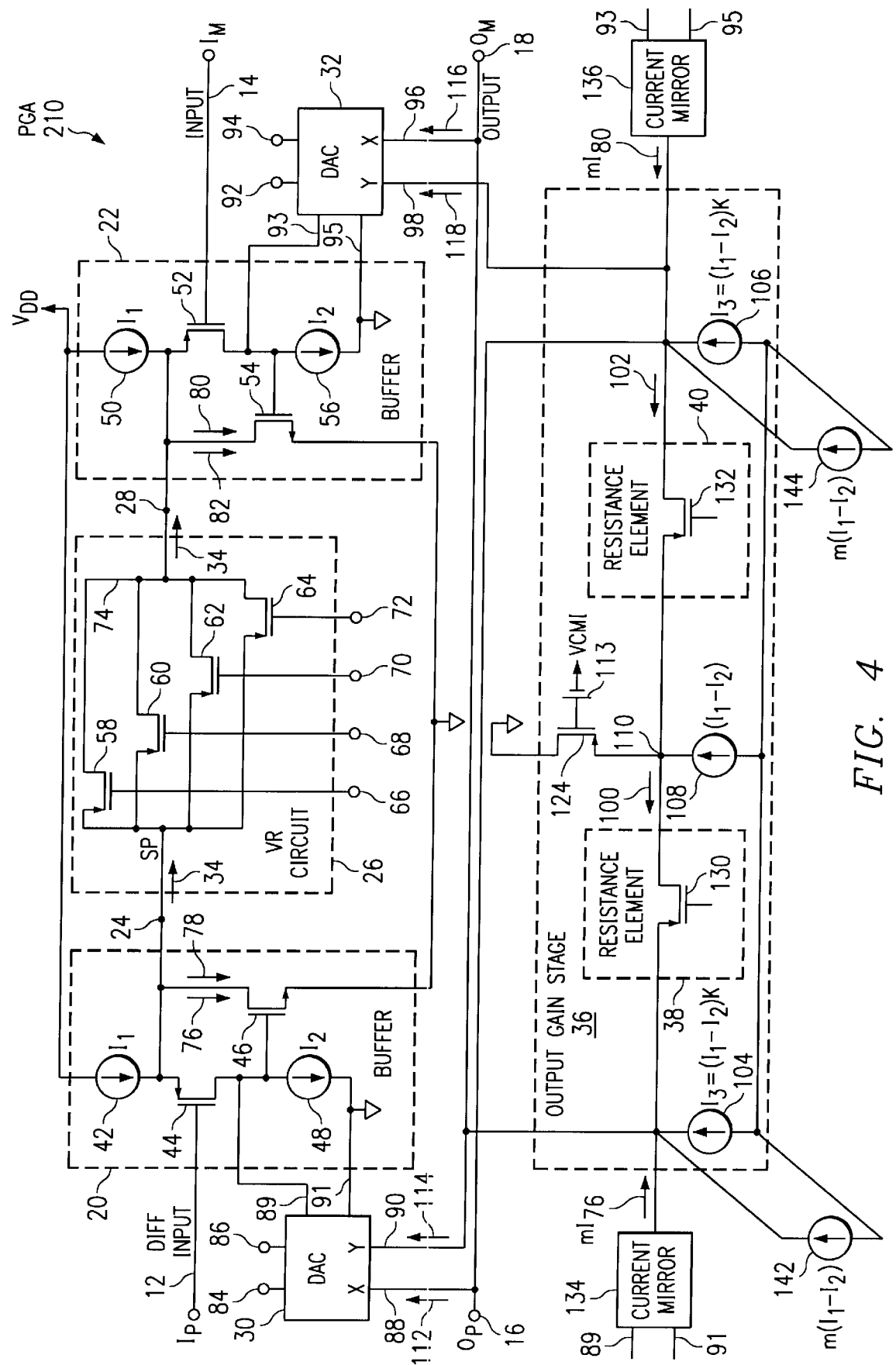
FIG. 4 is a schematic diagram illustrating another embodiment of a programmable gain amplifier according to the teachings of the invention, having additional fixed gain components.

FIG. 4 illustrates a programmable gain amplifier 210 according to the teachings of the invention, having additional fixed gain components. Fixed gain components 134 and 136 are both current mirrors having a gain of M. Current mirror 134 is connected to buffer 20 at nodes 89 and 91 and therefore mirrors current 76 through transistor 46. Current mirror 134 therefore produces a current having a magnitude of $MI_{76}$ as an output. This current is provided to output gain stage 36 at node 138. Similarly current mirror 136 is connected to buffer 22 at nodes 93 and 95 and therefore mirrors current 80 through transistor 54. Current mirror 136 therefore produces an output current $MI_{80}$ and provides that current to node 140 of output gain stage 36. In addition current sources 142 and 144 that each produce a current of $M(I_1-I_2)$ are provided. As illustrated, current source 142 is placed in parallel with current source 104 and current source 144 is placed in parallel with current source 106.

Therefore, in this embodiment, current 102 through resistance element 40 may be calculated to be $$I_{102} = -KI_{34}(2A-1) + MI_{34} \tag{16}$$

and current 100 through resistance element 38 may be calculated to be $$I_{100} = KI_{34}(2A-1) - MI_{34}. \tag{17}$$

Combining equations 12, 16, and 17 show the gain 219 of programmable gain amplifier 310 to be programmable gain amplifier 210 having a gain 219 of:

$$\text{Gain (219)} = 2[-K(2A-1) + M] \tag{18}$$

where:

K=a constant gain of digital-to-analog converters 30 and 32 as defined above;

A=a constant from 0 to 1 determining the fractional amount of output currents 90 and 98 as defined above; and M=a constant gain for fixed gain components 134, 136, 142, and 144.

Thus programmable gain amplifier 210 has a fixed gain 2M, which can be trimmed by plus or minus 2K.

Therefore, the invention provides three methods for controlling the gain of an amplifier. First, the gain of amplifier 10 or 210 may be controlled by controlling the resistance of variable resistance circuit 26. This may be accomplished by selectively turning on or off transistors 58, 60, 62 and 64. Second, the gain of programmable gain amplifier 210 may be adjusted by varying constant M. Finally, the gain of programmable gain amplifiers 10 and 210 may be adjusted by varying constants K and A.

Although the present invention and its advantages have been described in detail, it should be understood the various changes, substitutions, and alterations can be made therein without departing from the spirit and scope of the present invention as defined by the appended claims.

What is claimed is:

1. A programmable gain amplifier for producing a programmable voltage gain, the amplifier comprising:

a voltage input differential pair operable to receive a differential voltage input signal, the voltage input differential pair comprising a first input node and a second input node, the first input node for receiving a first voltage input signal and the second input node for receiving a second voltage input signal;

a variable resistance circuit disposed between the first input node and the second input node and operable to produce a signal current through the variable resistance circuit in response to the differential voltage input signal, the variable resistance circuit comprising a plurality of transistors connected in parallel, each of plurality of transistors being independently controllable;

a load resistance circuit operable to receive at least a portion of the signal current and produce a voltage drop across the load resistance circuit; and wherein the ratio of the differential voltage input signal to the voltage drop across the load resistance circuit is affected by the resistance of the variable resistance system.

2. The programmable gain amplifier of claim 1, wherein the load resistance circuit comprises at least one transistor and wherein the at least one transistor in the load resistance circuit and the plurality of transistors in the variable resistance circuit have a common mode voltage applied across each transistor, the common mode voltages being approximately equal in magnitude.

3. The programmable gain amplifier of claim 1, wherein each of the plurality of transistors comprises a plurality of control nodes operable to selectively allow an associated transistor to conduct electricity or not to conduct electricity in response to a voltage applied to the control node.

4. A programmable gain amplifier for producing a programmable voltage gain, the amplifier comprising:

a voltage input differential pair operable to receive a differential voltage input signal, the voltage input differential pair comprising a first input node and a second input node, the first input node for receiving a first voltage input signal and a second input node for receiving a second voltage input signal;

a variable resistance circuit disposed between the first input node and the second input node and operable to produce a signal current through the variable resistance circuit in response to the differential voltage input signal, the variable resistance circuit comprising a plurality of transistors connected in parallel;

a load resistance circuit operable to receive at least a portion of the signal current and produce a voltage drop across the load resistance circuit; and wherein the ratio of the differential voltage input signal to the voltage drop across the load resistance circuit is affected by the resistance of the variable resistance circuit, and further comprising a pair of current mirrors operable to mirror at least a portion of the signal current.

5. The programmable gain amplifier of claim 4, wherein the pair of current mirrors comprises first and second digital-to-analog converters.

6. A programmable gain amplifier for producing a programmable voltage gain, the amplifier comprising:

a voltage input differential pair operable to receive a differential voltage input signal, the voltage input differential pair comprising a first input node and a second input node, the first input node for receiving a first voltage input signal and a second input node for receiving a second voltage input signal;

a variable resistance circuit disposed between the first input node and the second input node and operable to produce a signal current through the variable resistance circuit in response to the differential voltage input signal, the variable resistance circuit comprising a plurality of transistors connected in parallel;

a load resistance circuit operable to receive at least a portion of the signal current and produce a voltage drop across the load resistance circuit; and wherein the ratio of the differential voltage input signal to the voltage drop across the load resistance circuit is affected by the resistance of the variable resistance circuit, and further comprising at least one current mirror and at least one current source operable in combination to provide a fixed gain component to the ratio of the differential voltage input signal to the voltage drop across the load resistance circuit.

7. The programmable gain amplifier of claim 5, wherein the first digital-to-analog converter further comprises a pair of input nodes and is operable to provide first and second currents to the load resistance circuit, the ratio of the magnitude of the first current to the second current being controlled by a signals received at the pair of input nodes.

8. A programmable gain amplifier for producing a programmable voltage gain, the amplifier comprising:

a voltage input differential pair operable to receive a differential voltage input signal, the voltage input differential pair comprising a first input node and a second input node, the first input node for receiving a first voltage input signal and the second input node for receiving a second voltage input signal;

a first buffer operable to buffer the first voltage input signal to generate a first buffer output signal;

a second buffer operable to buffer the second voltage input signal to generate a second buffer output signal;

a variable resistance circuit operable to receive the first buffer output signal and the second buffer output signal to generate a signal current;

a first current mirror operable to mirror a current comprising the signal current to generate a first current mirror output current;

a second current mirror operable to mirror a current including the signal current to generate a second current mirror output current;

a first load resistance circuit operable to receive the first current mirror output current and the second current mirror output current to generate a first voltage output signal;

a second load resistance circuit operable to receive the first current mirror output current and the second current mirror output current to generate a second voltage output signal, the first voltage output signal and the second voltage output signal forming a differential voltage output signal; and wherein the ratio of the differential voltage output signal to the differential voltage input signal is determined, at least in part, by the resistance of the variable resistance circuit.

9. The programmable gain amplifier of claim 8, wherein the variable resistance circuit comprises a plurality of transistors connected in parallel.

10. The programmable gain amplifier of claim 9, wherein the first load resistance circuit comprises a transistor and the second load resistance circuit comprises a transistor.

11. The programmable gain amplifier of claim 10, wherein the transistor in the first load resistance circuit, the transistor in the second load resistance circuit, and the plurality of transistors in the variable resistance circuit have a common mode voltage applied across each transistor, the common mode voltages being approximately equal in magnitude.

12. The programmable gain amplifier of claim 8, wherein the first current mirror comprises a current digital-to-analog converter operable to mirror a current comprising the signal current, multiply the current comprising the signal current by a constant first gain, and generate a first digital-to-analog converter output current and a second digital-to-analog converter output current, the sum of the first digital-to-analog converter output current and the second digital-toanalog converter output current being equal to the product of the current comprising the signal current and the first gain.

13. The programmable gain amplifier of claim 12, wherein the second current mirror comprises a current digital-to-analog converter operable to mirror a current comprising the signal current, multiply the current comprising the signal current by a constant second gain, and generate a third digital-to-analog converter output current and a fourth digital-to-analog converter output current, the sum of the third digital-to-analog converter output current and the fourth digital-to-analog converter output current being equal to the product of the current comprising the signal current and the second gain and also being the second current mirror output current.

14. The programmable gain amplifier at claim 13, and further comprising a pair of voltage input nodes connected to the first current mirror for receiving a pair of current mirror voltage input signals, the current mirror input signals determining the constant, the constant affecting the ratio of the differential voltage output signal to the different voltage input signal.

15. The programmable gain amplifier at claim 9, wherein the plurality of transistors in the variable resistance circuit comprises P-channel field effect transistors, each field effect transistor having a source and a drain, each field effect transistor having a sufficient common mode voltage applied across each source and drain to cause the plurality of transistors to operate in a triode mode of operation.

16. The programmable gain amplifier of claim 9, wherein the plurality of transistors comprises a plurality of field effect transistors each having a gate and further comprising a plurality of control nodes connected in a one-to-one fashion to the plurality of gates, and wherein the resistance of the variable resistance circuit is determined by a plurality of voltages applied to the gates.

17. A method for producing a variable gain in an electrical signal, the method comprising:

providing a variable resistance circuit having a plurality of transistors connected in parallel;

controlling the resistance of the variable resistance circuit by applying a voltage to a control node of each of the plurality of transistors to selectively turn each transistor on or off;

receiving a differential input voltage and applying the differential voltage across the variable resistance circuit to produce a signal current;

providing at least a portion of the signal current to a load resistance circuit to generate a differential output voltage; and setting the ratio of the differential output voltage to the differential input voltage by controlling the voltage applied to the control node of each of the plurality of transistors, each of said plurality of transistors being independently controlled.

18. The method of claim 17, wherein the step of controlling the resistance of the variable resistance circuit comprises selectively turning each of the plurality of transistors on or off.

19. The method of claim 17, wherein the step of providing at least a portion of the signal current to a load resistance circuit further comprises providing at least a portion of the current signal to a load transistor and setting a common mode voltage for the load transistor to be equal to a common mode voltage for each of the plurality of transistors.

20. The method of claim 17, and further comprising providing a fixed gain component to the ratio of the differential output voltage to the differential input voltage.

* * * * *